United States Patent
Ben Mohamed et al.

(10) Patent No.: US 7,326,628 B2
(45) Date of Patent: Feb. 5, 2008

(54) THIN LAYER TRANSFER METHOD UTILIZING CO-IMPLANTATION TO REDUCE BLISTER FORMATION AND TO SURFACE ROUGHNESS

(75) Inventors: Nadia Ben Mohamed, Renage (FR); Nguyet-Phuong Nguyen, Grenoble (FR); Takeshi Akatsu, St. Nazaire les Eymes (FR); Alice Boussagol, Brignoud (FR); Gabriela Suciu, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 282 days.

(21) Appl. No.: 11/181,405

(22) Filed: Jul. 13, 2005

(65) Prior Publication Data

US 2006/0060943 A1    Mar. 23, 2006

Related U.S. Application Data

(63) Continuation of application No. PCT/IB2004/003300, filed on Sep. 21, 2004.

(51) Int. Cl.
*H01L 21/30* (2006.01)
(52) U.S. Cl. .................. 438/458; 438/510; 438/118
(58) Field of Classification Search ............. 438/510, 438/458, 118
See application file for complete search history.

(56) References Cited

U.S. PATENT DOCUMENTS 5,966,620 A * 10/1999 Sakaguchi et al. .......... 438/455
6,593,212 B1 * 7/2003 Kub et al. .................. 438/458

(Continued)

FOREIGN PATENT DOCUMENTS

JP    11-087668    3/1999

(Continued)

OTHER PUBLICATIONS

A. Agarwal et al., "Efficient production of silicon-on-insulator films by co-implantation of HE+ with H+," Applied Physics Letters, vol. 72, No. 9, 1086-1088 (1998).

(Continued)

*Primary Examiner*—Carl Whitehead, Jr.
*Assistant Examiner*—Sonya D. McCall-Shepard
(74) *Attorney, Agent, or Firm*—Winston & Strawn LLP

(57) ABSTRACT

A method for producing a semiconductor structure by conducting controlled co-implanting of at least first and second different atomic species into a donor substrate to create an embrittlement zone which defines a thin layer of donor material to be transferred. Implantation energies are selected so that the first and second species are respectively distributed in the donor wafer according to a repartition profile that presents a spreading zone in which each species is mainly distributed at a maximum concentration peak. The implantation doses and energies of the first and second species are selected such that the second species is implanted deeper in the embrittlement zone than the first species spreading zone. The donor substrate is detached at the embrittlement zone to transfer the thin layer to the support substrate while minimizing blister formation in and surface roughness of the transferred layer. Preferably, the implantation dose of the first species is between about 40 to 60 percent of all implantation doses. This method is preferably utilized for forming or producing SeOI (Semiconductor On Insulator) structures.

16 Claims, 1 Drawing Sheet

U.S. PATENT DOCUMENTS

| | | | |
|---|---|---|---|
| 6,600,173 B2* | 7/2003 | Tiwari | 257/74 |
| 2003/0077885 A1 | 4/2003 | Aspar et al. | 438/517 |
| 2005/0026426 A1* | 2/2005 | Maleville et al. | 438/663 |

FOREIGN PATENT DOCUMENTS

WO    WO 2004/042779 A2    5/2004

OTHER PUBLICATIONS

J.-P. Colinge, Silicon-on-Insulator Technology: Materials to VLSI, 2nd Edition, Kluwer Academic Publishers, 50-51 (1997).

F. Corni et al., "Some aspects of blistering and exfoliation of helium-hydrogen coimplanted (100 silicon,"0 Nuclear Instruments and methods in Physics Research B, vol. 186, Issues 1-4, 349-354 (2002).

V.P. Popov et al., "Blistering on a silicon surface in the process of sequential hydrogen/helium ion co-implantation," Optoelectronics, Instrumentation and Data Processing, No. 3, 90-98 (2001).

Duo et al., "Comparison between the different implantation orders in H+ and He+ coimplantation," J. Phys. D: Appl. Phys. 34: 477-482 (2001).

Duo et al., "Defects and strain in hydrogen and helium co-implanted silicon," Electrochemical Society Proceedings, vol. 2001-3, pp. 69-74 (2001).

Weldon et al., "Mechanism of silicon exfoliation induced by hydrogen/helium co-implantation," Applied Physics Letters 73(25): 3721-3723 (1998).

* cited by examiner

THIN LAYER TRANSFER METHOD UTILIZING CO-IMPLANTATION TO REDUCE BLISTER FORMATION AND TO SURFACE ROUGHNESS

CROSS-REFERENCE TO RELATED APPLICATIONS

This application is a continuation of International Application PCT/IB2004/003300 filed Sep. 21, 2004, the entire content of which is expressly incorporated herein by reference thereto.

BACKGROUND

The present invention relates to a method for producing a structure that includes a thin layer of semiconductor material on a substrate. The method includes the steps of:

carrying out implantation of species under a face of a donor substrate from which the thin layer must be made, so as to create an embrittlement zone in the thickness of the donor substrate, placing the face of the donor substrate into close contact with a support substrate, after it has undergone implantation, detaching the donor substrate at the level of the embrittlement zone, so as to transfer a part of the donor substrate onto the support substrate and to form the thin layer on the latter.

The invention relates more precisely to the above-mentioned implantation step.

SMARTCUT® type processes, for which more ample details can be found in the document 'Silicon-On-Insulator Technology: Materials to VLSI, 2nd Edition', by Jean-Pierre Colinge from Kluwer Academic Publishers, pp. 50 and 51, are an example of methods of the type mentioned hereinabove and correspond to a preferred embodiment of the invention Such processes advantageously produce structures comprising a thin layer of semiconductor material, such as SeOI (Semiconductor On Insulator) structures and the like.

The resulting structures from such processes are used for applications in the field of microelectronics, optics and/or optronics.

Implantation of species is understood to mean any technique (such as bombardment, diffusion and the like) suitable for introducing atomic or ionic species onto the material of the implanted donor substrate, with a maximum concentration of the implanted species situated at a preset depth from the substrate relative to the surface of the implanted substrate.

The implantation step can be performed by co-implanting at least two different species. A common advantage of the co-implantation technique is the reduction by a factor of 3 approximately of the implanted dose relative to the implantation of a single type of species.

For instance, it is established in the article by Aditya Agarwal, T. E. Haynes, V. C. Venezia, O. W. Holland, and D. J. Eaglesham, "Efficient production of silicon-on-insulator films by co-implantation of He+ with H+", Applied Physics Letters, vol. 72 (1998), pp. 1086-1088, that the co-implantation of hydrogen H and helium He enables thin layer detachment at a much lower total implantation dose than that required when either hydrogen or helium alone is implanted. This reduction translates by reduction in the implantation time, and finally in costs associated with production of structures comprising a thin layer on a support substrate, in particular by means of a SMARTCUT® type transfer process. As it is mentioned in this article, the essential role of hydrogen H is to interact chemically with the implantation damage and to create H-stabilized platelet-like defects, or microvoids, in the implanted donor substrate. In the other hand, helium He plays a predominantly physical role and acts as a source of internal pressure in the implanted donor substrate for providing stress in said defects. Thus, He drives growth and eventual intersection of the microvoids so that two continuous separable surfaces may thereafter form on each side of the embrittlement zone.

The face of the donor substrate under which implantation is carried out is thereafter placed into close contact with the face of the support substrate, in order for bonds to create in between said faces at their interface called bonding interface. However, if particles or organic substances are present on the surfaces to be bonded, they may prevent the bonding to efficiently take place at certain sites at the bonding interface and voids may thus appear between the bonded substrates. Furthermore, the implanted species can thus easily diffuse into these voids, thus forming blisters at the bonding interface. This is in particular the case when the structure obtained after the donor and support substrates have been placed into close contact is subjected to a thermal treatment intended in particular to strengthen the bonding or to detach the donor substrate at the level of the embrittlement zone. Moreover the presence of voids can lead to the establishment of imperfectly bonded areas where the bonding strength may not be sufficient for allowing the detachment of the donor substrate at the level of the embrittlement zone so that some areas (called "non transferred zones") of the thin layer may not be transferred onto the support substrate.

In addition, it has to be noted that the implantation step degrades the quality of the surface of the face of the donor substrate under which implantation is carried out and which is to be placed into close contact with the donor substrate, thus increasing the risk that blisters are formed at the bonding interface and that zones are not transferred onto the support substrate. Blisters are not desired since they decrease the effective usable wafer surface area and hence decrease the production yield. Wafers presenting blisters are even rejected from the production line. Consider a donor substrate made of silicon Si (and which may optionally comprise a superficial $SiO_2$ layer), wherein the substrate has undergone co-implantation of He and H atoms. It is generally known that the risk of blister formation increases if He is implanted close to the bonding interface. Thus, a number of methods are usually carried out in order in an attempt to avoid blister formation.

A first method relates to implanting He atoms deeper than H atoms within the donor substrate (starting from the donor substrate's face under which implantation is carried), that is by providing an adequate He implantation energy which can be calibrated thanks to SIMS analysis. Another method relates to increasing the H dose to be implanted, typically by a couple of $10^{15}$ H atoms/cm². Of course both these methods can be implemented jointly. The effect of these methods is illustrated by Table 1 below which represents the number of blisters detected as a co-implantation of He and H atoms has been performed under the following co-implantation conditions:

a dose of He atoms of $12 \times 10^{15}$/cm²;

a He implantation energy as indicated along the Y axis, that is 34, 40 and 46 keV;

a dose of H atoms implanted as indicated along the X axis, that is 9, 12 and $15 \times 10^{15}$/cm²;

a H implantation energy of 27 keV.

TABLE 1

| Y | | | |
|---|---|---|---|
| 46 | 1 | 0 | 0 |
| 40 | 1 | 0 | 0 |
| 34 | 0.67 | 0.67 | 0 |
| | 9 | 12 | 15 |

X →

In the lowest row, corresponding to the smallest He implantation energy and thus to the shallowest He implantation depth, blister formation is observed. However as the He implantation energy increases (He being thus implanted deeper), less blister formation is observed. In other words, the deeper He is implanted, a reduced blister formation is observed. In the left-hand side column of the Table, corresponding to the lowest H dose, blister formation is observed. However, as the H dose increases (see center and right hand side columns), blister formation decreases. In other words, the higher the H dose is, a reduced blister formation is observed. In both methods, the H implanted region is regarded as acting as a gettering region or barrier making it possible to block the diffusion of He towards the bonding interface. As mentioned above, the donor substrate is detached at the level of the embrittlement zone created in its thickness by the implantation step so as to transfer a part of the donor substrate onto the support substrate and to form the thin layer on the latter.

The specifications of the surface state of the structures obtained by transfer processes such as the SMARTCUT® process are generally very strict. Indeed, the roughness of the thin layer is a parameter which to a certain extent conditions the quality of the components which will be created on the structure. There is thus a need for limiting as much as possible the surface roughness of the thin layer, and thus to implement the implantation step under conditions making it possible to limit the roughness. Table 2 presented below shows the surface roughness measured after the detachment step has been performed and the resulting structure has been subjected to a RTA (Rapid Thermal Annealing) adapted for gumming out certain roughnesses by surface reconstruction. The co-implantation conditions are the same as those exposed in relation with Table 1. The surface roughness has more precisely been measured on a surface of 10×10 µm² swept by the point of an atomic force microscope AFM and is expressed by an average quadratic value known as RMS (Root Mean Square).

TABLE 2

| Y | | | |
|---|---|---|---|
| 46 | 4.8 | 5.01 | 8.48 |
| 40 | 3.59 | 5.62 | 10.5 |
| 34 | 4.63 | 5.76 | 7.12 |
| | 9 | 12 | 15 |

X →

It is apparent from this table that the two best conditions for limiting the roughness are those underlined on the upper part of the left hand side column. However these conditions result, as shown in Table 1, in the formation of blisters. On the other hand, conditions that do not cause blisters to form are conditions which also do not limit roughness. Hence, as the comparison of Table 1 and Table 2 makes it clear, certain implantation conditions that result in the best roughness may lead to undesirable blister formation and, reciprocally, conditions that avoid blister formation may result in poor surface roughness. It thus appears that surface roughness and blister formation cannot be controlled separately. Hence a compromise has to be made between the best conditions (e.g., implantation energies and doses) for avoiding blister formation and the best conditions for limiting the resulting surface roughness. It is mentioned here that such a compromise may have to be conducted for controlling not only roughness but also other parameters such as the thickness homogeneity of the transferred thin layer, the thickness of the damage zone, the splitting temperature, etc.

There is thus a need for a method for producing a high quality structure comprising a thin layer of semiconductor material on a substrate for which the co-implantation conditions are optimally controlled, in particular in order both to avoid blisters formation and to limit the resulting surface roughness.

SUMMARY OF THE INVENTION

The invention relates to a method for producing a semiconductor structure which comprises conducting controlled co-implanting of at least first and second different atomic species into a face of donor substrate to create an embrittlement zone which defines a thin layer of donor material to be transferred. This step is conducted by selecting implantation energies so that the coimplanting is made under conditions such that the first and second species are respectively distributed in the donor wafer according to a repartition profile that presents a spreading zone in which each species is mainly distributed and at a maximum concentration peak. Also, the implantation doses and implantation energies of the first and second species are selected such that the second species is implanted deeper in the embrittlement zone than the first species spreading zone, with the first species selected to provide essentially chemical implantation to thus form platelet defects in the donor substrate, and with the second species selected to provide physical implantation to thus act as a source of internal pressure in the donor wafer to impart stress upon the platelet defects. Next, the face of the donor substrate is placed into contact with a support substrate, and then the donor substrate is detached at the embrittlement zone to transfer the thin layer to the support substrate while minimizing blister formation in and surface roughness of the transferred layer. Preferably, the implantation dose of the first species is between about 40 to 60 percent and generally about 50% of all implantation doses. This method is preferably utilized for forming or producing SeOI (Semiconductor On Insulator) structures.

The invention also relates to an intermediate structure obtained just after the co-implementation step of the method. This structure comprises a donor substrate that includes controlled co-implanted first and second different atomic species that create an embrittlement zone which defines a thin layer of donor material to be transferred, with the first and second species respectively distributed in the donor wafer according to a repartition profile that presents a spreading zone in which each species is mainly distributed and at a maximum concentration peak. As noted above, the second species is implanted deeper in the embrittlement zone than the first species spreading zone, and the first species provides essentially chemical implantation to thus form platelet defects in the donor substrate, while the second species provides physical implantation to thus act as a source of internal pressure in the donor wafer to impart stress upon the platelet defects.

In the method and product, the most preferred first species is Hydrogen and the most preferred second species is Helium.

BRIEF DESCRIPTION OF THE DRAWING

Other characteristics, purposes and advantages of the invention will appear to the reading of the following detailed description, with respect to the annexed drawing, given as non restrictive example, in which.

DETAILED DESCRIPTION OF THE PREFERRED EMBODIMENTS

Figure 1:
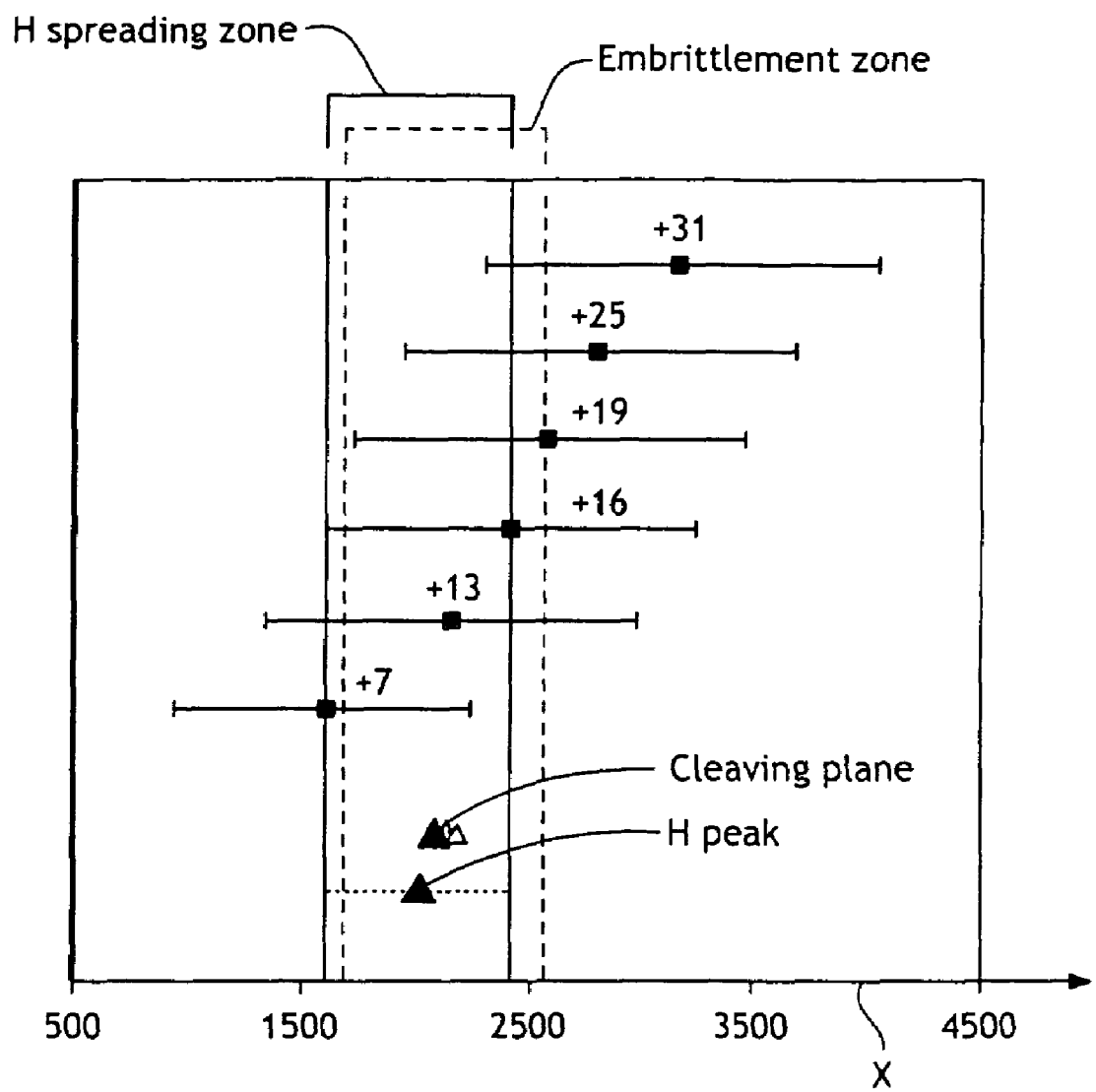
FIG. 1 shows for different deltas between Helium and Hydrogen implantation energies, the distribution of Helium which is to be compared both with the distribution of Hydrogen and with the position of the embrittlement zone.
Figure 1:
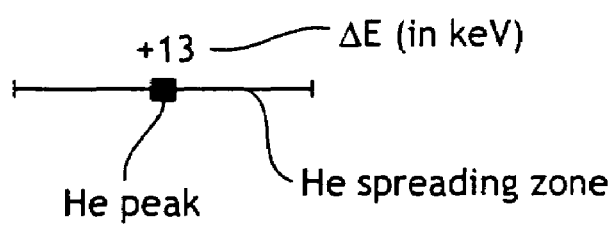

In order to fill the unresolved needs of the prior art, the invention proposes, according to a first aspect, a method for producing a structure comprising a thin layer of semiconductor material on a substrate, comprising the steps consisting in:

performing a co-implantation of at least two different species under a face of a donor substrate from which the thin layer must be made, so as to create an embrittlement zone in the thickness of the donor substrate, placing the face of the donor substrate into close contact with a support substrate, after it has undergone implantation, detaching the donor substrate at the level of the embrittlement zone, so as to transfer a part of the donor substrate onto the support substrate and to form the thin layer on the latter, at least a first species being implanted acting essentially chemically for forming platelet-like defects in the donor substrate, at least a second species being implanted acting essentially physically as a source of internal pressure in the implanted donor substrate for providing stress in said defects, each of said first and second species being respectively distributed in the thickness of the donor substrate according to a repartition profile presenting a spreading zone wherein the species is mainly distributed and presents a maximum concentration peak, the method being characterised in that the co-implantation step is performed according to co-implantation conditions according to which the implantation energies of said first and second species are selected such that said second species peak is located in the thickness of the donor substrate within said embrittlement zone and more in-depth than said first species spreading zone, and the implantation doses of said first and second species are selected to be substantially similar, the first species implantation dose counting from 40% to 60% of the total implantation dose.

Preferred but non restrictive forms of the method according to the invention are as follows.

the donor substrate being a silicon substrate (eventually comprising a superficial $SiO_2$ layer), the implantation doses of said first and second species can be selected for the total implanted dose to be a dose lower than substantially $3.2 \times 10^{16}/cm^2$;

the total implantation dose can be lower than $2.2 \times 10^{16}/cm^2$;

the implantation dose of each species can be comprised between $0.9 \times 10^{16}/cm^2$ and $1.5 \times 10^{16}/cm^2$;

the offset between the first species maximum concentration peak and the second species maximum concentration peak may be comprised substantially between 500 and 1000 angstroms.

the co-implantation step can be performed by co-implanting Helium and Hydrogen, Helium acting essentially physically and Hydrogen acting essentially chemically in the donor substrate;

the co-implantation step may be performed by co-implanting sequentially Helium then Hydrogen;

the support substrate can be a silicon substrate, and may eventually comprise on its top a superficial oxide layer;

the method may further comprise, before the face of the donor substrate is placed into close contact with the support substrate, a plasma activation treatment of at least one of the faces of the donor and support substrates which are to be placed into close contact.

The invention also relates to the intermediate structure obtained just after the co-implementation step of the method according to the first aspect of the invention.

And the invention also relates to the application of the method according to the first aspect of the invention to the production of SeOI (Semiconductor On Insulator) structures.

As previously noted, the invention relates to the co-implantation step performed during the production of structures comprising a thin layer of semiconductor material on a support substrate, the thin layer being obtained by detachment at the level of a donor substrate previously embrittled by implantation of species. The invention can aid in improving the quality of a structure obtained by utilizing a transfer process such as the SMARTCUT® type.

The structure can, in general, be any type of structure comprising a thin layer of a semiconductor material on a surface exposed to the external environment. In a non restrictive way, the thin layer of semiconductor material can be silicon Si, silicon carbide SiC, germanium Ge, silicon-germanium SiGe, gallium arsenic AsGa, etc. The substrate support can be made of silicon Si, quartz, etc. or other common semiconductor materials. If desired, a layer of oxide can also be intercalated in between the support substrate and the thin layer, the structure therefore formed being a SeOI (Semiconductor On Insulator) structure, and in particular a SOI (Silicon On Insulator) structure.

The implantation step according to the invention includes carrying out a co-implantation of at least two different species so as to create the embrittlement zone along a plane called cleaving plane in the thickness of the donor substrate. During the implantation step, each species distribute in the thickness of the implanted donor substrate according to a repartition profile presenting a spreading zone wherein the species is mainly distributed and presents its maximum concentration peak. More precisely, the repartition has a quasi-Gaussian profile presenting a standard deviation (defining said spreading zone wherein the implanted species is mainly distributed, for instance wherein 70% of the implanted species is concentrated) and a maximum concentration peak which depend in particular on the implantation energy.

Among the co-implanted species, at least a first implanted species acts essentially chemically for forming platelet-like defects in the donor substrate, and at least a second implanted species acts essentially physically as a source of internal pressure in the implanted donor substrate for providing stress in said defects. It has been found that Hydrogen and Helium are preferred species for this co-implantation. In accordance with a preferred embodiment of the method according to the invention, the Hydrogen and Helium species are co-implanted in order to form the embrittlement zone in the thickness of a silicon Si donor substrate.

As already mentioned above in relation to Agarwal's article, in such a case, Hydrogen is the species which acts essentially chemically whereas Helium is the species which acts essentially physically. Furthermore one thus profits from the effect exposed in copending application Ser. No. 10/691,403 filed Oct. 21, 2003, according to which co-implantation of (a low dose of) Helium and Hydrogen results, when combined with a finishing step comprising a rapid thermal annealing (RTA) of the structure obtained post-detachment, in the transfer of thin layers with a reduced level of roughness relative to the transfer following implantation of (a higher dose of) hydrogen alone. Preferably, though not exclusively, co-implantation is carried out by sequentially implanting Helium then Hydrogen.

Returning to the description of the method according to the invention, the co-implantation step is performed with co-implantation conditions according to which the first and second species implantation energies are such that the second species (the physically acting one; for instance He) peak is substantially located in the thickness of the donor substrate within the embrittlement zone and more in-depth than the first species (the chemically acting one; for instance H) spreading zone. The co-implantation conditions are moreover selected for the implantation doses of the implanted species to be substantially similar, the first species implantation dose counting from 40% to 60% of the total implantation dose.

Indeed, several experiments have been conducted to determine that controlling the implantation energies such that the second species peak is located in the thickness of the donor substrate more in-depth than the first species spreading zone would allow avoiding blisters formation. Moreover, these experiments show that controlling the implantation energies such that the second species peak is located in the thickness of the donor substrate within the embrittlement zone would also help limiting roughness. The description hereafter concerns more precisely these experiments as well as a discussion of the mechanisms implied in the method according to the invention.

Firstly, different SOI (Silicon On Insulator) structures were produced, the co-implantation step consisting in the sequential implantation of He then H. The implantation doses were fixed, respectively, as $1.2 \times 10^{16}/cm^2$ for He and $0.9 \times 10^{16}/cm^2$ for H. The H implantation energy was also fixed (27 keV) whereas the different experiments were conducted for different He implantation energies. A comparison was made for the different implantation conditions upon the SOI surface quality according to quality parameters such as the number of blisters and the roughness after the detachment step, as well as the roughness after several final classical treatment steps (which will be detailed hereafter) were conducted.

Secondary Ion Mass Spectroscopy (SIMS) analysis were operated (post implantation, after the implantation step was performed) to investigate the concentration distribution profile of the implanted species in the silicon donor substrate, and more particularly to determinate the position of their maximum concentration peak and spreading zone. By taking into account the positions of He and H maximum concentration peaks, as well as the possible overlapping of their spreading zones, the position of the Helium peak can be qualified of either "less in-depth", "within", or "more in depth" than the Hydrogen spreading zone. TEM (Transmission Electron Microscopy) and Reflectometry layer thickness analysis were also conducted (post detachment, after the detachment step was implemented) in order to determinate the position within the embrittlement zone of the cleaving plane where the detachment takes place. More precisely, said cleaving plane position is deducted from the thickness of the thin layer formed on the support substrate. A reflectometry layer thickness analysis was also conducted after the structure obtained post detachment was subjected to a finishing step consisting in a rapid thermal annealing (RTA).

By taking into account the position of the He maximum concentration peak, as well as the possible overlapping of the He distribution profile with the embrittlement zone, the position of the Helium peak can also be qualified of either "less in-depth", "within", or "more in depth" than the embrittlement zone. Table 3 here below shows, for different investigated deltas $\Delta E$ between He implantation energy and H implantation energy, the results of the above mentioned analysis while Table 4 qualifies the positions of the Helium peak relatively to the embrittlement zone and to the Hydrogen spreading zone.

FIG. 1 schematically shows, for the different investigated deltas $\Delta E$ between He implantation energy and H implantation energy, the positions (along the X axis representing the depth in angstroms from the face of the donor substrate under which implantation has been performed) of the He peak and spreading zone to be compared both with the position of the H peak and spreading zone, and with the position of the cleaving plane and embrittlement zone in order to obtain the nomenclature mentioned in Table 4.

TABLE 3

| Reference (Implantation dose in atoms/cm$^2$: He: $1.2 \times 10^{16}$ H: $0.9 \times 10^{16}$) | SIMS post-implantation | | Cleaving plane (Å) | | | Offset (Å) | |
|---|---|---|---|---|---|---|---|
| | He peak (Å) | H peak (Å) | TEM post-detachment | Reflectometry post-detachment | Reflectometry post-RTA | Between H and He peaks | Between cleaving plane and He peak |
| 0) H only | | 1990 | 2040 | | | | |
| 1) $\Delta E = +7$ | 1580 | 1990 | 2060 | 2060 | 2047 | 410 | 485 |
| 2) $\Delta E = +13$ | 2150 | 1990 | 2172 | 2050 | 2040 | −160 | −95 |
| 3) $\Delta E = +16$ | 2400 | 1990 | | | 2035 | −410 | −350 |

TABLE 3-continued

| Reference (Implantation dose in atoms/cm$^2$: He: 1.2 × 10$^{16}$ H: 0.9 × 10$^{16}$) | SIMS post-implantation | | Cleaving plane (Å) | | | Offset (Å) | |
|---|---|---|---|---|---|---|---|
| | He peak (Å) | H peak (Å) | TEM post-detachment | Reflectometry post-detachment | Reflectometry post-RTA | Between H and He peaks | Between cleaving plane and He peak |
| 4) ΔE = +19 | 2575 | 1990 | 2112 | 2060 | 2045 | −585 | −515 |
| 5) ΔE = +25 | 2800 | 1990 | | | 2065 | −810 | −720 |
| 6) ΔE = +31 | 3150 | 1990 | | | 2070 | −1160 | −1065 |

It can be noted that the cleaving plane is always "more in-depth" than the Hydrogen peak, even when the He peak is "less in-depth" than the H spreading zone (see reference 1). In addition, the cleaving plane is always in the vicinity of the Hydrogen peak (for a few tens of Ångströms), even when the He peak is "more in-depth" than the H spreading zone (see references 4, 5 and 6).

TABLE 4

| Reference | delta ΔE between He and H implantation energies | He peak position relatively to the embrittlement zone | He peak position relatively to the H spreading zone |
|---|---|---|---|
| 1 | +7 | less in-depth | less in-depth |
| 2 | +13 | within | within |
| 3 | +16 | within | within |
| 4 | +19 | within | more in-depth |
| 5 | +25 | more in-depth | more in-depth |
| 6 | +31 | more in-depth | more in-depth |

After the detachment step, the eventual presence of blisters was investigated for each of the above mentioned structures. Moreover, surface roughness measurements were also carried out after detachment both by sweeping the point of an AFM (Atomic Force Microscope) on a surface of 10*10 μm$^2$ over the thin layer surface (once it has been transferred onto the support substrate), and by using a Dektak profile meter.

Generally speaking, AFM measurements characterize high frequencies roughnesses while Dektak profile meter measurements characterize low frequencies roughnesses.

Table 5 hereafter recapitulates these observations and measurements.

TABLE 5

| Reference | Percentage of wafers with blisters | He peak position relatively to the embrittlement zone | He peak position relatively to the H spreading zone | AFM RMS (+/−5 Å) | Profile meter RMS (+/−1 Å) |
|---|---|---|---|---|---|
| H only | 0 | | | 52 | 27 |
| 1 (ΔE = +7) | 67 | less in-depth | less in-depth | 61 | 13 |
| 2 (ΔE = +13) | 50 | within | within | 53 | 12 |
| 3 (ΔE = +16) | 50 | Within | within | 54 | 11 |
| 4 (ΔE = +19) | 0-50 | Within | more in-depth | 54 | 11 |
| 5 (ΔE = +25) | 0 | more in-depth | more in-depth | 61 | 11 |
| 6 (ΔE = +31) | 0 | more in-depth | more in-depth | 71 | 13 |

It can thus be observed that the numbers of formed blisters is all the more important as He implantation energy is weak (that is when energies offset between He and H is, in the experiments conditions, lower than 20 keV). However, when He is implanted so that its peak is "more in-depth" than the H repartition profile (that is when energies offset between He and H is higher than 20 keV), no blisters are formed.

It can also be observed that the roughness is with the lowest when He is implanted so that its peak is located "within" the embrittlement zone, and that at the same time for high and low frequencies roughnesses. On the contrary, roughness gets higher when the implantation conditions are such that He is implanted so that its peak is "less in-depth" or "more in-depth" than the embrittlement zone, and that more especially as the He repartition peak moves away from said embrittlement zone.

It has to be noted that high frequencies roughnesses values (AFM measurements) are relatively similar, whether a co-implantation of He and H or an implantation of H only is performed. On the other hand, one observes that low frequencies roughnesses are significantly lowered (more than half) for all co-implantation conditions comparatively to implantation of H alone.

As mentioned above, the structures obtained post detachment can be subjected to a finishing step comprising a rapid thermal annealing (RTA) adapted for gumming out certain roughnesses by surface reconstruction, and especially the high frequency roughnesses disclosed in copending application Ser. No. 10/691,403. The finishing step of the structure obtained post detachment can in addition to this RTA (RTA1) furthermore comprise the following combination of treatment operations: a stabilised oxidation (StabBox), a second RTA (RTA2) and a thinning operation. An important profit can be obtained after RTA1 with regard to roughness when co-implantation is used instead of implantation of a single species only. Furthermore RMS values as low as 2.5 Å (10*10 μm$^2$ scan) can be reached after said final thinning operation when co-implantation is performed. Hence when the He peak is located within the embrittlement zone, the final structure presents a low roughness whereas said roughness increases as said He peak profile shifts away (either less in-depth or more in-depth) from the embrittlement zone.

The blisters formation tendency can be described of the following manner. The closest He is implanted from the face under which implantation has been carried, the more blisters will generate at this interface, possibly because of diffusion. In the other hand, when He is implanted "more in-depth" than H in the donor substrate, He will find, under annealing treatment, on its diffusing path, platelets-type defects formed by H implantation and which are thus located in the donor substrate within the H distribution profile, and which will trap He and limit blister formation.

The implantation conditions should thus be selected in order for He (or more generally speaking the physically acting species) to be distributed, within the thickness of the donor substrate, according to a repartition profile presenting a peak which is more in-depth than the zone where H is mainly spread (or more generally speaking the zone where the chemically acting species is mainly spread). It has to be noted here that for the He dose ($1.2 \times 10^{16}$/cm$^2$) used in the context of the experiment, no blisters formation was observed when He is implanted in such manner that its peak is more in-depth than H spreading zone. However, if He were to be implanted with a much higher dose, all of the He may not be trapped by the H-stabilized platelet-like defects and could thus diffuse and form blisters. As disclosed in copending application Ser. No. 10/691,403, the co-implantation of a low dose of Helium and Hydrogen results, when combined with a finishing step comprising a rapid thermal annealing (RTA) of the structure obtained post-detachment, in the transfer of thin layers with a reduced level of roughness relative to the transfer following implantation of (a higher dose of) hydrogen alone.

However it has been shown here above that the roughness depends in particular on the relative position of He peak to the embrittlement zone. Indeed when the He peak is either "less in-depth" or "more in-depth" than the embrittlement zone, roughness is more important than when the He peak is located "within" the embrittlement zone, thus close to the cleaving plane. It is believed that a maximum of He is trapped in the maximum H concentration zone when the He profile has been positioned close to the H profile. He concentration at the level of the embrittlement zone is in that case maximum and results in reduced roughness. Conversely, when He implantation is performed either far "less in depth" or far "more in depth" than the embrittlement zone, He contributes less, and roughness is increased. The implantation conditions should thus be also selected in order for He (or more generally speaking the physically acting species) to be distributed, within the thickness of the donor substrate, according to a repartition profile which present a peak which is located within the embrittlement zone.

For these purposes, the difference between the second species implantation energy and the first species implantation energy can for instance selected for the offset between the first species maximum concentration peak and the second species maximum concentration peak (as determined for instance by SIMS analysis) to be substantially comprised between 500 and 1000 angstroms. Implantation conditions that were investigated here above only concern the implantation energies. However implantation doses were also investigated during a second set of experiments in order to optimally control the whole of the co-implantation conditions necessary for producing a high quality structure comprising a thin layer of semiconductor material on a substrate. Typically the implantation doses of co-implanted species can be selected for the total implantation dose to be lower than substantially $3.2 \times 10^{16}$/cm$^2$, and preferably less than $2.2 \times 10^{16}$/cm$^2$, that is a lower total implantation dose than when a only single species is implanted.

The implantation energies used for producing the structure referenced 3 herein (and leading to the minimal 2.5 Å RMS final roughness value) were kept identical in this second set of experiments, that is He being implanted at an energy of 43 keV and H being implanted at an energy of 27 keV. Roughness and blisters formations were observed as He and H implantation doses were modified. First of all, the H dose was increased from $0.9 \times 10^{16}$/cm$^2$ to $1.3 \times 10^{16}$/cm$^2$ while the He dose was kept fixed, equal to $0.9 \times 10^{16}$/cm$^2$ (that is lower than during the first set of experiments for which the He dose was $1.2 \times 10^{16}$/cm$^2$). None of the investigated co-implantation conditions (maximal H dose equal to $1.3 \times 10^{16}$/cm$^2$) leads to blisters formation. However as the H dose increases, roughness deteriorates. Then, the He dose was varied while the H dose was kept fixed (equal to $1.1 \times 10^{16}$/cm$^2$) and the energies were also fixed (He energy of 49 keV; H energy of 32 keV).

As the He dose increases, blisters formation occurs. However the roughness is low for all the investigated structures (the final roughness being as low as 2.3 Å RMS on a 10*10 μm$^2$ scan when the He dose reaches $1.5 \times 10^{16}$/cm$^2$). Finally, it can be derived from this second set of experiments that the best result can be reached as for a low roughness and the avoidance of blisters when the implantation doses of the two species are substantially similar, the first species implantation dose counting typically from 40% to 60% of the total implantation dose. Advantageously, the implantation dose of each species is comprised between $0.9 \times 10^{16}$/cm$^2$ and $1.5 \times 10^{16}$/cm$^2$.

A surface activation treatment, such as a plasma activation, may further be performed which may help (in particular when the implantation doses are such that a repartition close to 60%/40% is achieved) to reduce residual blisters and achieve good roughness. This plasma activation is performed, before the face of the donor substrate is placed into close contact with the support substrate, on at least one of the faces of the donor and support substrates which are to be placed into close contact.

Under another aspect, the invention also relates to the intermediate structure obtained just after the co-implementation step of the method according to the previously described first aspect of the invention. And under another aspect the invention furthermore relates to the application of the method according to the first aspect of the invention to the production of SeOI (Semiconductor On Insulator) structures.

The description herein relates specifically with SOI manufacturing and He—H co-implantation. The man skilled in the art will understand that a similar approach could be carried out for other semiconductor material (such as for instance Ge, SiGe, GaN, SiC) or other type of co-implantation

What is claimed is:

1. A method for producing a semiconductor structure which comprises:
   conducting controlled co-implanting of at least first and second different atomic species into a face of donor substrate to create an embrittlement zone which defines a thin layer of donor material to be transferred, by selecting implantation energies so that the coimplanting is made under conditions such that the first and second species are respectively distributed in the donor wafer according to a repartition profile that presents a spreading zone in which each species is mainly distributed and at a maximum concentration peak, with the implantation doses and implantation energies of the first and second species selected such that the second species is implanted deeper in the embrittlement zone than the first species spreading zone, with the first species selected to provide essentially chemical implantation to thus form platelet defects in the donor substrate, and with the second species selected to provide physical implantation to thus act as a source of internal pressure in the donor wafer to impart stress upon the platelet defects, and wherein the implantation dose of the first species is between about 40 to 60 percent of all implantation doses;

placing the face of the donor substrate into contact with a support substrate, and detaching the donor substrate at the embrittlement zone to transfer the thin layer to the support substrate while minimizing blister formation in and surface roughness of the transferred layer, wherein the offset between the first species maximum concentration peak and the second species maximum concentration peak is between about 500 and about 1000 angstrorns.

2. The method of claim 1, wherein the donor substrate is a silicon substrate, and the first and second species are implanted at a total implanted dose that is lower than about $3.2 \times 10^{16}/cm^2$.

3. The method of claim 2, wherein the total implantation dose is lower than $2.2 \times 10^{16}/cm^2$.

4. The method of claim 2, wherein the implantation dose of each species is between about $0.9 \times 10^{16}/cm^2$ and $1.5 \times 10^{16}/cm^2$.

5. The method of claim 1, wherein the implantation dose of the first species represents approximately half the amount of all implantation doses.

6. A method for producing a semiconductor structure which comprises:

conducting controlled co-implanting of at least Hydrogen and Helium atomic species into a face of donor substrate to create an embrittlement zone which defines a thin layer of donor material to be transferred, by selecting implantation energies so that the co-implanting is made under conditions such that the Hydrogen and Helium atomic species are respectively distributed in the donor wafer according to a repartition profile that presents a spreading zone in which each species is mainly distributed and at a maximum concentration peak, with the implantation doses and implantation energies of the Hydrogen and Helium atomic species selected such that the Helium species is implanted deeper in the embrittlement zone than the Hydrogen species spreading zone, with the Hydrogen species selected to provide essentially chemical implantation to thus form platelet defects in the donor substrate, and with the Helium species selected to provide physical implantation to thus act as a source of internal pressure in the donor wafer to impart stress upon the platelet defects, and wherein the implantation dose of the first species is between about 40 to 60 percent of all implantation doses placing the face of the donor substrate into contact with a support substrate, and detaching the donor substrate at the embrittlement zone to transfer the thin layer to the support substrate while minimizing blister formation in and surface roughness of the transferred layer wherein the offset between the Hydrogen species maximum concentration peak and the Helium species maximum concentration peak is between about 500 and about 1000 angstroms, and wherein the co-implantation step is performed by co-implanting sequentially Helium and then Hydrogen.

7. A method for producing a semiconductor structure which comprises:

conducting controlled co-implanting of at least first and second different atomic species into a face of donor substrate to create an embrittlement zone which defines a thin layer of donor material to be transferred, by selecting implantation energies so that the coimplanting is made under conditions such that the first and second species are respectively distributed in the donor wafer according to a repartition profile that presents a spreading zone in which each species is mainly distributed and at a maximum concentration peak, with the implantation doses and implantation energies of the first and second species selected such that the second species is implanted deeper in the embrittlement zone than the first species spreading zone, with the first species selected to provide essentially chemical implantation to thus form platelet defects in the donor substrate, and with the second species selected to provide physical implantation to thus act as a source of internal pressure in the donor wafer to impart stress upon the platelet defects, and wherein the implantation dose of the first species is between about 40 to 60 percent of all implantation doses;

placing the face of the donor substrate into contact with a support substrate, and detaching the donor substrate at the embrittlement zone to transfer the thin layer to the support substrate while minimizing blister formation in and surface roughness of the transferred layer, wherein the support substrate is made of silicon.

8. The method of claim 7, wherein the silicon donor substrate comprises a superficial oxide layer.

9. The method of claim 1, which further comprises, before the face of the donor substrate is placed into close contact with the support substrate, a plasma activation treatment of at least one of the faces of the donor and support substrates which are to be placed into close contact.

10. An intermediate structure obtained just after the co-implementation step of claim 6, and comprising a donor substrate that includes controlled co-implanted first and second different atomic species that create an embrittlement zone which defines a thin layer of donor material to be transferred, with the first and second species respectively distributed in the donor wafer according to a repartition profile that presents a spreading zone in which each species is mainly distributed and at a maximum concentration peak, with the second species being implanted deeper in the embrittlement zone than the first species spreading zone, with the first species providing essentially chemical implantation to thus form platelet defects in the donor substrate, and the second species providing physical implantation to thus act as a source of internal pressure in the donor wafer to impart stress upon the platelet defects.

11. A method for producing SeOI (Semiconductor On Insulator) structures which comprises:

conducting controlled co-implanting of at least first and second different atomic species into a face of donor substrate to create an embrittlement zone which defines a thin layer of donor material to be transferred, by selecting implantation energies so that the coimplanting is made under conditions such that the first and second species are respectively distributed in the donor wafer according to a repartition profile that presents a spreading zone in which each species is mainly distributed and at a maximum concentration peak, with the implantation doses and implantation energies of the first and second species selected such that the second species is implanted deeper in the embrittlement zone than the first species spreading zone, with the first species selected to provide essentially chemical implantation to thus form platelet defects in the donor substrate, and with the second species selected to provide physical implantation to thus act as a source of internal pressure in the donor wafer to impart stress upon the platelet defects, and wherein the implantation dose of the first species is between about 40 to 60 percent of all implantation doses:

placing the face of the donor substrate into contact with a support substrate, and detaching the donor substrate at the embrittlement zone to transfer the thin layer to the support substrate while minimizing blister formation in and surface roughness of the transferred layer.

12. The method according to claim 1, wherein the implantation energies of the first and second species are selected such that a difference of at least 19 keV exists therebetween to assist in implanting the second species deeper in the embrittlement zone than the first species.

13. The method according to claim 1, wherein the implantation energies of the first and second species are selected such that a difference of at least 20 keV exists therebetween to assist in implanting the second species deeper in the embrittlement zone than the first species.

14. The method of claim 6, which further comprises, before the face of the donor substrate is placed into close contact with the support substrate, a plasma activation treatment of at least one of the faces of the donor and support substrates which are to be placed into close contact.

15. An intermediate structure obtained just after the co-implementation step of claim 7, and comprising a donor substrate that includes controlled co-implanted first and second different atomic species that create an embrittlement zone which defines a thin layer of donor material to be transferred, with the first and second species respectively distributed in the donor wafer according to a repartition profile that presents a spreading zone in which each species is mainly distributed and at a maximum concentration peak. with the second species being implanted deeper in the embrittlement zone than the first species spreading zone, with the first species providing essentially chemical implantation to thus form platelet defects in the donor substrate, and the second species providing physical implantation to thus act as a source of internal pressure in the donor wafer to impart stress upon the platelet defects.

16. An intermediate structure obtained just after the co-implementation step of claim 11, and comprising a donor substrate that includes controlled co-implanted first and second different atomic species that create an embrittlement zone which defines a thin layer of donor material to be transferred, with the first and second species respectively distributed in the donor wafer according to a repartition profile that presents a spreading zone in which each species is mainly distributed and at a maximum concentration peak, with the second species being implanted deeper in the embrittlement zone than the first species spreading zone, with the first species providing essentially chemical implantation to thus form platelet defects in the donor substrate, and the second species providing physical implantation to thus act as a source of internal pressure in the donor wafer to impart stress upon the platelet defects.

* * * * *

UNITED STATES PATENT AND TRADEMARK OFFICE
CERTIFICATE OF CORRECTION

PATENT NO. : 7,326,628 B2
APPLICATION NO. : 11/181405
DATED : February 5, 2008
INVENTOR(S) : Ben Mohamed et al.

Page 1 of 1

It is certified that error appears in the above-identified patent and that said Letters Patent is hereby corrected as shown below:

Column 13:
Line 24 (claim 1, last line), change "angstrorns" to -- angstroms --.

Column 16:
Line 11 (claim 15, line 9), change "peak." to -- peak, --.

Signed and Sealed this

Thirteenth Day of May, 2008

JON W. DUDAS
*Director of the United States Patent and Trademark Office*